US011178765B2

(12) United States Patent
Baba

(10) Patent No.: US 11,178,765 B2
(45) Date of Patent: Nov. 16, 2021

(54) ELECTRONIC DEVICE

(71) Applicant: Murata Manufacturing Co., Ltd., Nagaokakyo (JP)

(72) Inventor: Takahiro Baba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 13 days.

(21) Appl. No.: 16/556,268

(22) Filed: Aug. 30, 2019

(65) Prior Publication Data
US 2019/0387626 A1 Dec. 19, 2019

Related U.S. Application Data

(63) Continuation of application No. PCT/JP2018/009419, filed on Mar. 12, 2018.

(30) Foreign Application Priority Data

Mar. 31, 2017 (JP) .............................. JP2017-070382

(51) Int. Cl.
H05K 1/14 (2006.01)
H01L 23/32 (2006.01)
(Continued)

(52) U.S. Cl.
CPC .............. *H05K 1/14* (2013.01); *H01L 23/32* (2013.01); *H05K 1/116* (2013.01); *H05K 1/181* (2013.01); *H05K 2201/10378* (2013.01)

(58) Field of Classification Search
CPC .......... H05K 1/14; H05K 1/116; H05K 1/181; H05K 2201/10378; H05K 1/144;
(Continued)

(56) References Cited

U.S. PATENT DOCUMENTS

2005/0260867 A1* 11/2005 Ono ....................... H05K 1/144
439/65
2009/0233465 A1 9/2009 Mizoguchi
(Continued)

FOREIGN PATENT DOCUMENTS

JP 2010-198427 A 9/2010
JP 2010-219180 A 9/2010
(Continued)

OTHER PUBLICATIONS

Official Communication issued in International Patent Application No. PCT/JP2018/009419, dated May 29, 2018.

*Primary Examiner* — Steven T Sawyer
(74) *Attorney, Agent, or Firm* — Keating & Bennett, LLP

(57) ABSTRACT

An electronic device includes first and second circuit boards and an interposer substrate. The first principal surface of the interposer substrate faces the first circuit board, and the second principal surface of the interposer substrate faces the second circuit board. A first input/output pad and a first auxiliary pad are provided on the first principal surface of the interposer substrate, and a second input/output pad and a second auxiliary pad portion are provided on the second principal surface of the interposer substrate. The first circuit board includes a land that is connected to the first input/output pad and the first auxiliary pad, and the second circuit board includes a land that is connected to the second input/output pad and the second auxiliary pad portion.

26 Claims, 15 Drawing Sheets

(51) Int. Cl.
*H05K 1/11* (2006.01)
*H05K 1/18* (2006.01)

(58) Field of Classification Search
CPC .......... H01L 23/32; H01L 2224/16225; H01L 23/49833; H01L 25/00; H01R 12/62
See application file for complete search history.

(56) References Cited

U.S. PATENT DOCUMENTS

| | | | |
|---|---|---|---|
| 2011/0269319 A1* | 11/2011 | Cheng | H01R 12/73 439/67 |
| 2011/0294315 A1 | 12/2011 | Kawabata et al. | |
| 2015/0091676 A1* | 4/2015 | Kato | H01P 3/085 333/246 |
| 2015/0359119 A1 | 12/2015 | Ota et al. | |
| 2016/0372811 A1 | 12/2016 | Yosui et al. | |
| 2017/0033426 A1 | 2/2017 | Baba et al. | |
| 2017/0125870 A1* | 5/2017 | Baba | H05K 1/0298 |

FOREIGN PATENT DOCUMENTS

| | | |
|---|---|---|
| WO | 2008/050448 A1 | 5/2008 |
| WO | 2014/002592 A1 | 1/2014 |
| WO | 2014/128795 A1 | 8/2014 |
| WO | 2015/146448 A1 | 10/2015 |
| WO | 2016/088592 A1 | 6/2016 |
| WO | 2016/088693 A1 | 6/2016 |

\* cited by examiner

ELECTRONIC DEVICE

CROSS REFERENCE TO RELATED APPLICATIONS

This application claims the benefit of priority to Japanese Patent Application No. 2017-070382 filed on Mar. 31, 2017 and is a Continuation Application of PCT Application No. PCT/JP2018/009419 filed on Mar. 12, 2018. The entire contents of each application are hereby incorporated herein by reference.

BACKGROUND OF THE INVENTION

1. Field of the Invention

The present invention relates to an electronic device that includes a plurality of circuit boards, the circuit boards respectively including a predetermined circuit and being connected to each other.

2. Description of the Related Art

With high integration of a circuit board provided in an electronic device, and also with a mixture of circuit boards that have different wiring densities, a structure in which circuit boards are electrically connected through an interposer as necessary has been used.

For example, International Publication No. 2014/002592 discloses a structure of fixing a cable to a wiring substrate by connecting a first circuit board and a second circuit board through an interposer substrate.

The interposer substrate is preferably surface-mounted to at least the first circuit board through a conductive bonding material in order to reduce the height of a structure after bonding. However, a large interposer substrate makes a space for mounting a component to the first circuit board or the second circuit board smaller.

In the structure of fixing a cable to a wiring substrate disclosed in International Publication No. 2014/002592, in a case in which, when the second circuit board is mounted on the first circuit board through the interposer substrate, the second circuit board is large to a certain extent or the interposer substrate is much smaller than the second circuit board, the second circuit board may not be able to be supported through the interposer substrate.

Even when a plurality of small interposer substrates are provided, it is necessary to provide a wiring that electrically connects different interposer substrates in the first circuit board or the second circuit board, so that the wiring space of the first circuit board or the second circuit board may be reduced.

SUMMARY OF THE INVENTION

Preferred embodiments of the present invention provide electronic devices that each include a plurality of circuit boards and an interposer substrate, the interposer substrate being capable of easily supporting a circuit board provided on the interposer substrate, the electronic device ensuring a space for mounting a component to the plurality of circuit boards as well as a wiring space.

An electronic device according to a preferred embodiment of the present invention includes a first circuit board, a second circuit board, and an interposer substrate that includes a first principal surface and a second principal surface and is entirely or substantially entirely interposed between the first circuit board and the second circuit board. The first principal surface of the interposer substrate faces the first circuit board, and the second principal surface of the interposer substrate faces the second circuit board. The interposer substrate includes a signal line that includes a first end and a second end, a first input/output pad that is provided on the first principal surface and is electrically connected to the first end of the signal line, and a second input/output pad that is provided on the second principal surface and is electrically connected to the second end of the signal line.

The interposer substrate further includes a first auxiliary pad that is provided on the first principal surface.

The first circuit board, on a surface that faces the interposer substrate, includes a first input/output land that is connected to the first input/output pad, and a first auxiliary land that is connected to the first auxiliary pad.

The first input/output pad and the first auxiliary pad are respectively directly soldered to the first input/output land and the first auxiliary land of the first circuit board, and the interposer substrate and the first circuit board are electrically connected to each other.

The second circuit board is electrically connected to the interposer substrate through the second input/output pad.

In the above structure, since the interposer substrate is connected and fixed to the input/output land and the auxiliary land of the first circuit board through the input/output pad and the auxiliary pad, the interposer substrate capable of supporting the second circuit board is easily and stably mounted on the first circuit board.

It is to be noted that, in order for the interposer substrate to support the second circuit board without disturbing the mounting of other mounted components, although it may be effective that the interposer substrate has an elongated shape or a shape with low symmetry, solder-mounting such an interposer substrate as well as other components causes an unstable state, which easily causes a mounting failure. The electronic device of the above-described preferred embodiment of present invention is able to avoid this problem.

The first auxiliary pad may preferably include a plurality of first auxiliary pad portions that are disposed along the signal line, and the first auxiliary land may preferably include a plurality of first auxiliary land portions that are disposed along the signal line. As a result, even when the interposer substrate has an elongated shape, such an interposer substrate as well as other components are able to be solder-mounted on the first circuit board.

The plurality of first auxiliary pad portions and the first input/output pad may preferably be disposed at equal or substantially equal intervals, and the plurality of first auxiliary land portions and the first input/output land may preferably be disposed at equal or substantially equal intervals. As a result, mounting capability of the interposer substrate to the first circuit board is improved, and the overall bonding strength is increased.

The interposer substrate may preferably include a second auxiliary pad that is provided on the second principal surface. The second circuit board, on a surface that faces the interposer substrate, may preferably include a second input/output land that is connected to the second input/output pad, and a second auxiliary land that is connected to the second auxiliary pad. The second input/output pad and the second auxiliary pad may preferably be respectively directly soldered to the second input/output land and the second auxiliary land of the second circuit board, and the interposer substrate and the second circuit board may preferably be electrically connected to each other.

In the above configuration, the interposer substrate and the second circuit board are also able to be surface-mounted using solder, and the first circuit board and the second circuit board are able to be bonded only by the thickness of the interposer substrate (with substantially no space), so that the first circuit board, the interposer substrate, and the second circuit board are able to be disposed even in a small space in the electronic device.

The second auxiliary pad may preferably include a plurality of second auxiliary pad portions that are disposed along the signal line, and the second auxiliary land may preferably include a plurality of second auxiliary land portions that are disposed along the signal line. As a result, even when the interposer substrate has an elongated shape, such an interposer substrate as well as other components are able to be solder-mounted on the second circuit board.

The plurality of second auxiliary pad portions and the second input/output pad may preferably be disposed at equal or substantially equal intervals, and the plurality of second auxiliary land portions and the second input/output land may preferably be disposed at equal or substantially equal intervals. As a result, mounting capability of the second circuit board to the interposer substrate is improved, and the overall bonding strength is increased.

The interposer substrate may preferably include a first connection portion that includes the first input/output pad, a second connection portion that includes the second input/output pad, and a line portion that is provided between the first connection portion and the second connection portion and has a smaller width than the first connection portion and the second connection portion. As a result, the occupation area of the interposer substrate is reduced, and the mounting space of a component and the wiring space of the first circuit board or the second circuit board are easily secured.

The interposer substrate may preferably include, as necessary, a first connection portion that includes the first input/output pad, a second connection portion that includes the second input/output pad, a line portion that is provided between the first connection portion and the second connection portion, and an auxiliary connection portion that is provided in a middle region of the line portion and includes no input/output pad, the first auxiliary pad may preferably be provided on the first principal surface of the auxiliary connection portion, the second auxiliary pad may preferably be provided on the second principal surface of the auxiliary connection portion, and the line portion may preferably have a smaller width than the first connection portion, the second connection portion, and the auxiliary connection portion. As a result, even when the line portion is long, the mounting capability of the interposer substrate to the first circuit board and the second circuit board is improved, and the overall bonding strength is increased.

The interposer substrate may preferably include an insulating base material layer that has a smaller effective relative dielectric constant than the first circuit board and the second circuit board. As a result, a capacitance component to be generated between the conductors in the interposer substrate is able to be reduced, which enables a reduction in thickness.

The interposer substrate may preferably include an insulating base material layer that has a smaller effective elastic modulus than the first circuit board and the second circuit board. As a result, the degree of freedom in the shape of the interposer substrate is increased, and the interposer substrate is also able to be mounted in a location with a level difference in a height direction, for example. In addition, the interposer substrate is also able to be curved in a plane direction.

The interposer substrate may preferably include a multilayer body including a plurality of insulating base material layers that include an insulating base material layer on which a conductor pattern is provided. As a result, the degree of integration of the conductor patterns in the interposer substrate is increased, and even a small interposer substrate enables the wiring between the first circuit board and the second circuit board.

The interposer substrate may preferably include ground conductors that are provided on a plurality of insulating base material layers, and the ground conductors, the signal line, an insulating base material layer between the ground conductors and the signal line may preferably define a stripline. As a result, the stripline is able to be used as an independent transmission line in the interposer substrate, and mutual interference between the transmission line and the circuit of the first circuit board and a second circuit board is significantly reduced or prevented.

The interposer substrate may preferably include a plurality of interlayer connection conductors that connect at a plurality of positions the ground conductors that are provided on different insulating base material layers of the stripline. As a result, unnecessary radiation to lateral sides of the stripline is also significantly reduced or prevented.

The interposer substrate may preferably include, as necessary, a bent portion that bends so as to avoid a component that is mounted on at least one of the first circuit board and the second circuit board. As a result, the effective occupation area of the interposer substrate is reduced, and the mounting space of a component and the wiring space of the first circuit board or the second circuit board are easily secured.

The interposer substrate may preferably, as necessary, surround a component that is mounted on at least one of the first circuit board and the second circuit board. As a result, the structure supporting the second circuit board by the interposer substrate is stabilized.

According to preferred embodiments of the present invention, electronic devices each include a plurality of circuit boards and an interposer substrate, the interposer substrate being capable of easily supporting a circuit board provided on the interposer substrate, the electronic devices each ensuring a space for mounting a component to the plurality of circuit boards as well as a wiring space.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
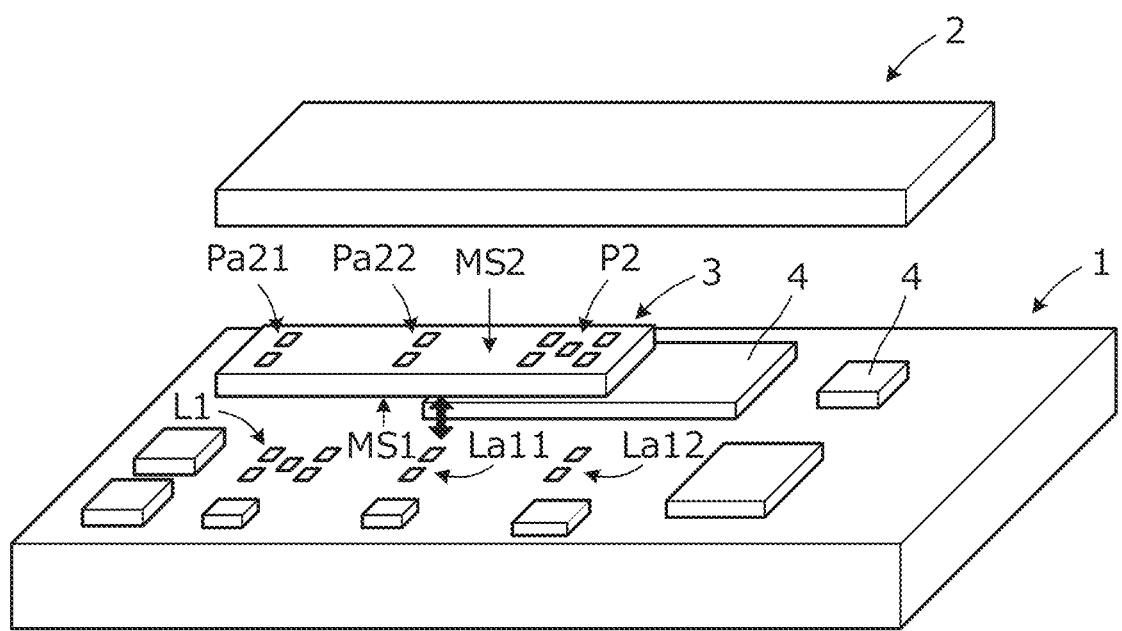
FIG. 1 is an exploded perspective view of a first circuit board 1, an interposer substrate 3, and a second circuit board 2 according to a first preferred embodiment of the present invention.

Hereinafter, a plurality of preferred embodiments of the present invention will be described with reference to the attached drawings and several specific examples. In the drawings, components and elements assigned with the same reference numerals or symbols will represent the same or corresponding components and elements. While preferred embodiments of the present invention are divided and described for the sake of convenience in consideration of ease of description or understanding of main points, elements described in different preferred embodiments are able to be partially replaced or combined with each other. In second and subsequent preferred embodiments, a description of matters common to the first preferred embodiment will be omitted and only differences therebetween are described. In particular, the same or substantially the same advantageous functions and effects by the same configurations will not be described one by one for each preferred embodiment.

First Preferred Embodiment

FIG. 1, FIG. 2, FIG. 3, and FIG. 4 are exploded perspective views of a main portion of an electronic device according to a first preferred embodiment of the present invention. The electronic device includes a first circuit board 1, a second circuit board 2, and an interposer substrate 3. The entirety or substantially the entirety of the interposer substrate 3 is interposed between the first circuit board 1 and the second circuit board 2.

Figure 2:
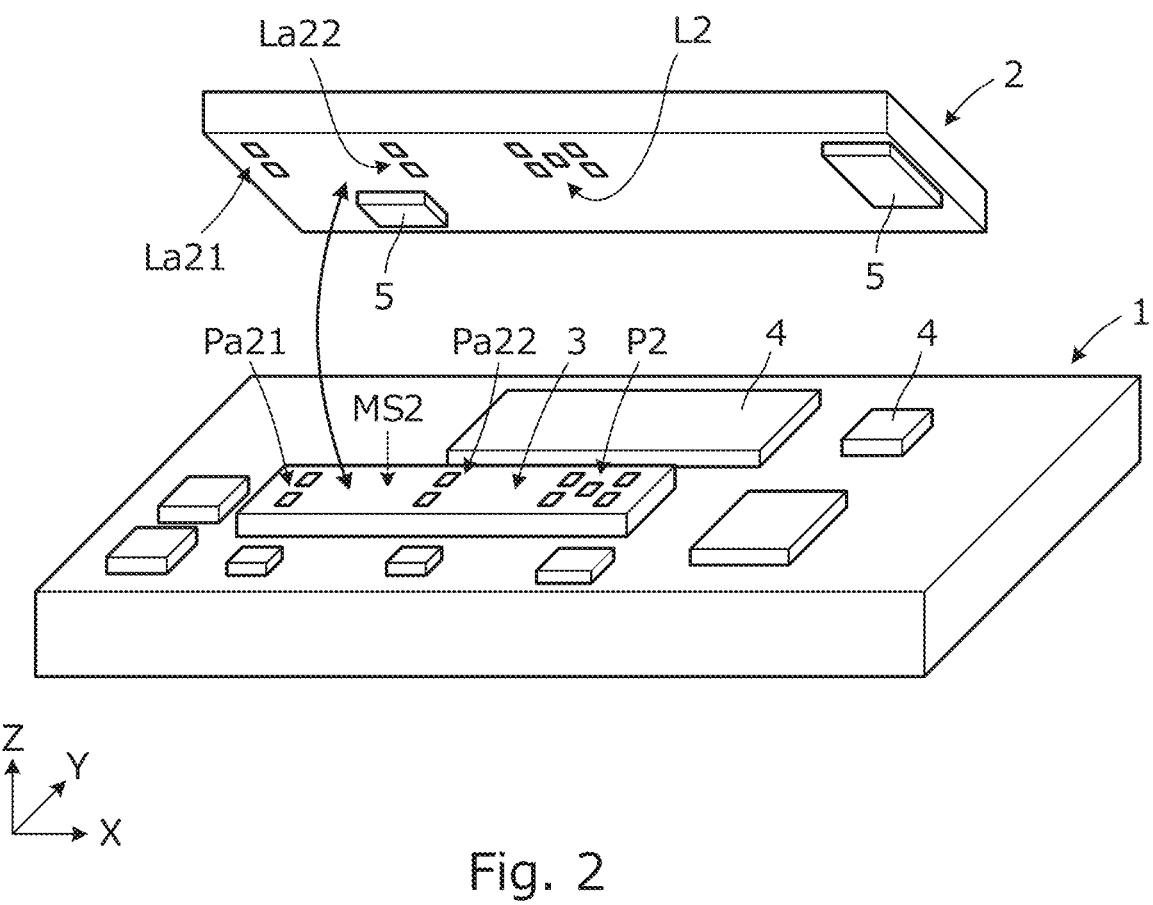
FIG. 2 is a perspective view in a state in which the interposer substrate 3 is mounted on the first circuit board 1, and the second circuit board 2 is tilted to make a bottom surface of the second circuit board 2 visible.
Figure 3:
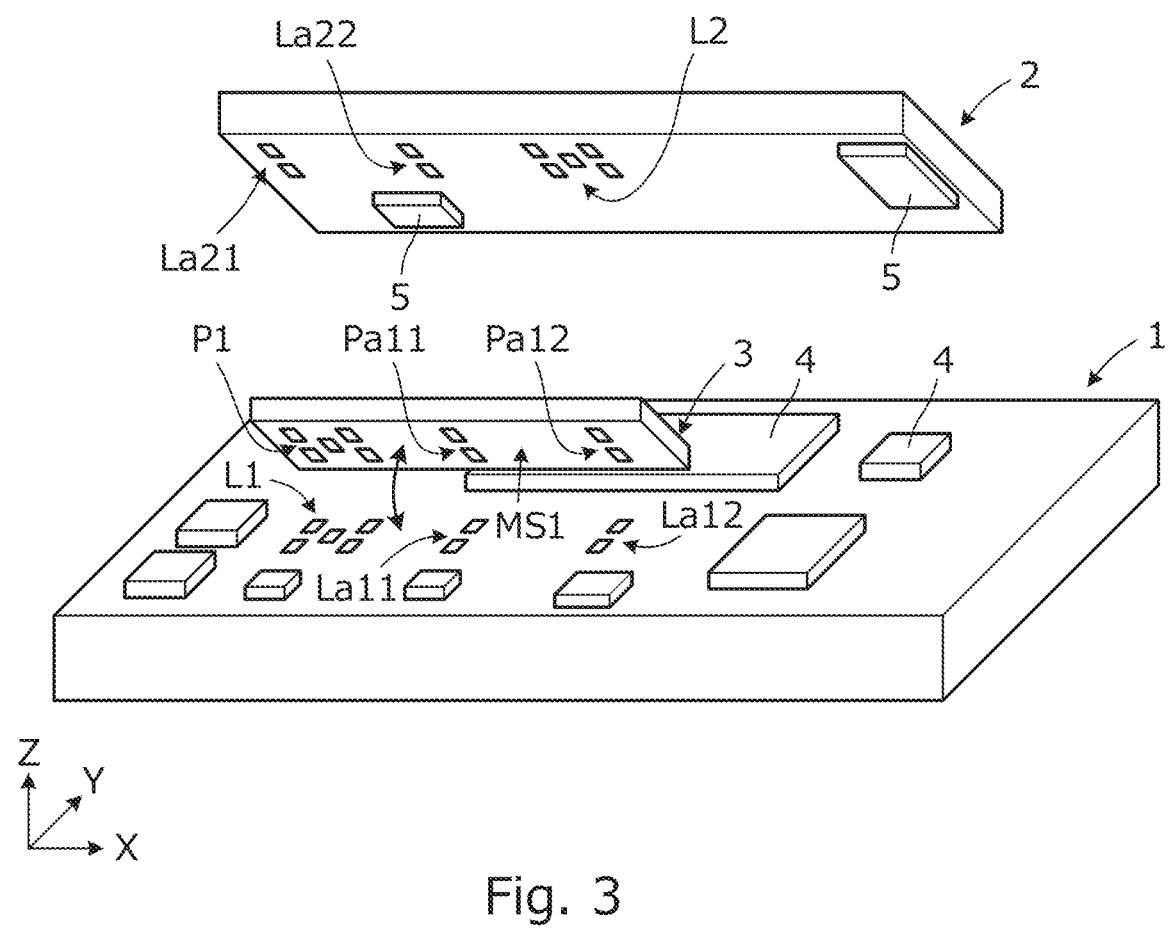
FIG. 3 is a perspective view in the state in which the second circuit board 2 and the interposer substrate 3 are tilted to make bottom surfaces of the second circuit board 2 and the interposer substrate 3 visible.
Figure 4:
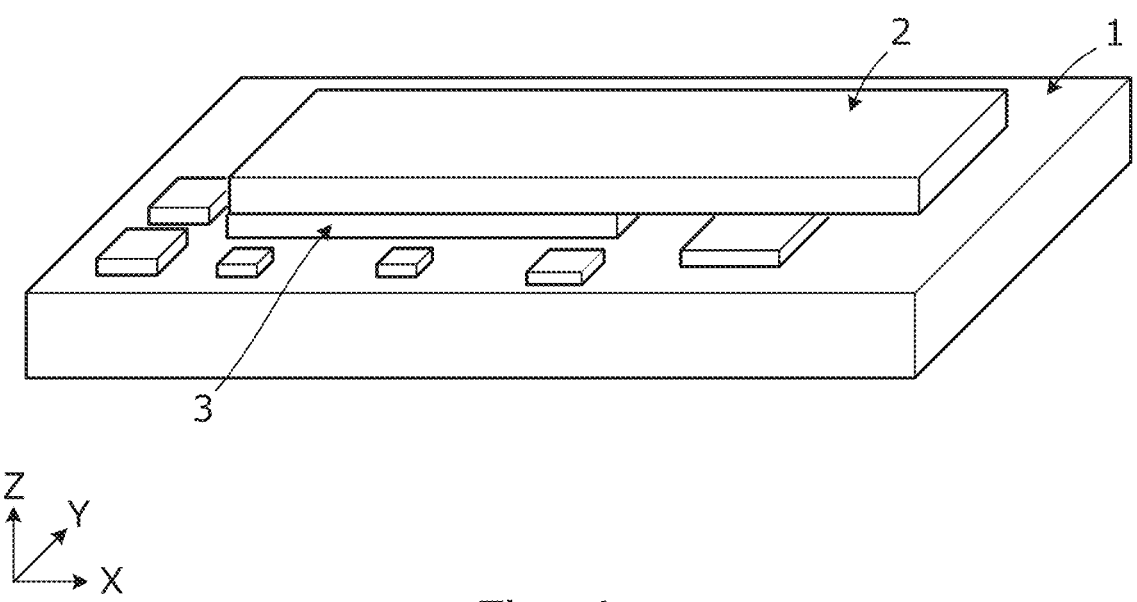
FIG. 4 is an exploded perspective view of a main portion of an electronic device according to the first preferred embodiment of the present invention.

FIG. 1 is an exploded perspective view of the first circuit board 1, the interposer substrate 3, and the second circuit board 2. FIG. 2 is a perspective view in a state in which the interposer substrate 3 is mounted on the first circuit board 1, and the second circuit board 2 is tilted to make a bottom surface of the second circuit board 2 visible. FIG. 3 is a perspective view in the state in which the second circuit board 2 and the interposer substrate 3 are tilted to make bottom surfaces of the second circuit board 2 and the interposer substrate 3 visible. In addition, FIG. 4 is a perspective view in a state in which the first circuit board 1 and the second circuit board 2 are stacked through the interposer substrate 3.

The interposer substrate 3 is mounted on a top surface of the first circuit board 1 including a plurality of components 4. A plurality of components 5 are mounted on the bottom surface of the second circuit board 2.

The interposer substrate 3 includes a first principal surface MS1 and a second principal surface MS2, and the first principal surface MS1 faces the first circuit board 1 and the second principal surface MS2 faces the second circuit board 2.

In addition, the interposer substrate 3 includes a signal line that includes a first end and a second end and will be described below, a first input/output pad P1 that is provided on the first principal surface MS1 and is electrically connected to the first end of the signal line, and a second input/output pad P2 that is provided on the second principal surface MS2 and is electrically connected to the second end of the signal line.

Furthermore, the interposer substrate 3 includes first auxiliary pad portions Pa11 and Pa12 that are provided on the first principal surface MS1.

The first circuit board 1, on a surface that faces the interposer substrate 3, includes a first input/output land L1 that is connected to the first input/output pad P1, and first auxiliary land portions La11 and La12 that is connected to the first auxiliary pad portions Pa11 and Pa12.

The first auxiliary pad portions Pa11 and Pa12 and the first input/output pad P1 are preferably disposed at equal or substantially equal intervals, and the first auxiliary land portions La11 and La12 and the first input/output land L1 are preferably disposed at equal or substantially equal intervals.

The first input/output pad P1 and the first auxiliary pad portions Pa11 and Pa12 are respectively directly soldered to the first input/output land L1 and the first auxiliary land portions La11 and La12 of the first circuit board 1, so that the interposer substrate 3 and the first circuit board 1 are electrically connected to each other.

The interposer substrate 3 further includes second auxiliary pad portions Pa21 and Pa22 that are provided on the second principal surface MS2.

The second circuit board 2, on a surface that faces the interposer substrate 3, includes a second input/output land L2 that is connected to the second input/output pad P2, and second auxiliary land portions La21 and La22 that is connected to the second auxiliary pad portions Pa21 and Pa22.

The second auxiliary pad portions Pa21 and Pa22 and the second input/output pad P2 are preferably disposed at equal or substantially equal intervals, and the second auxiliary land portions La21 and La22 and the second input/output land L2 are preferably disposed at equal or substantially equal intervals.

The second input/output pad P2 and the second auxiliary pad portions Pa21 and Pa22 are respectively directly soldered to the second input/output land L2 and the second auxiliary land portions La21 and La22 of the second circuit board 2, so that the interposer substrate 3 and the second circuit board 2 are electrically connected to each other.

Figure 5A:
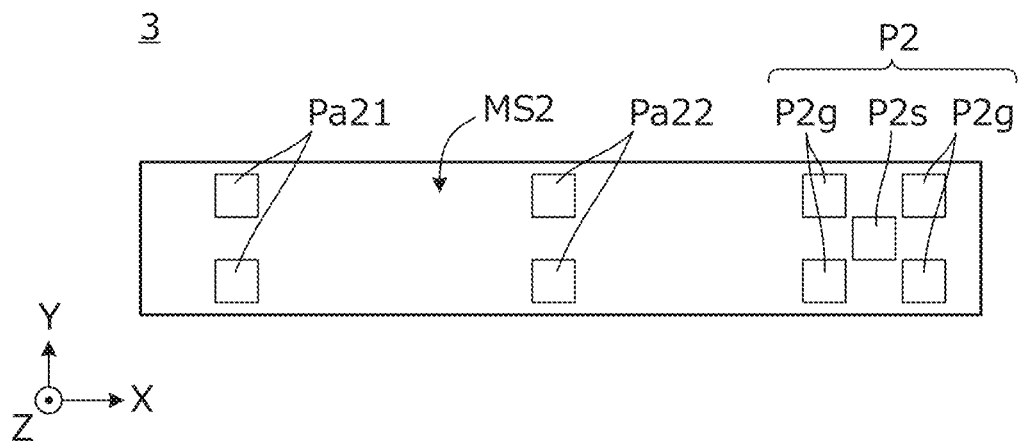
FIG. 5A is a plan view of the interposer substrate 3.
Figure 5B:
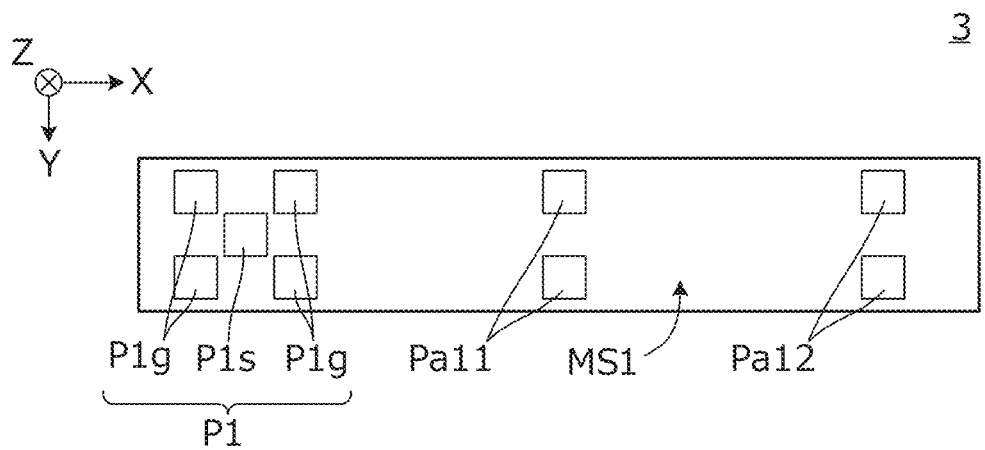
FIG. 5B is a bottom view of the interposer substrate 3.

FIG. 5A is a plan view of the interposer substrate 3, and FIG. 5B is a bottom view of the interposer substrate 3. The first input/output pad P1 and the first auxiliary pad portions Pa11 and Pa12 are provided on the first principal surface MS1 of the interposer substrate 3. The first input/output pad P1 includes, for example, an electrode P1$s$ that is connected to the signal line and four electrodes P1$g$ each of which is connected to a ground conductor. Each of the first auxiliary pad portions Pa11 and Pa12 is an electrode that is connected to a ground conductor. The second input/output pad P2 and the second auxiliary pad portions Pa21 and Pa22 are provided on the second principal surface MS2 of the interposer substrate 3. The second input/output pad P2 includes, for example, an electrode P2$s$ that is connected to the signal line and four electrodes P2$g$ each of which is connected to a ground conductor. Each of the second auxiliary pad portions Pa21 and Pa22 is an electrode that is connected to a ground conductor.

Figure 6:
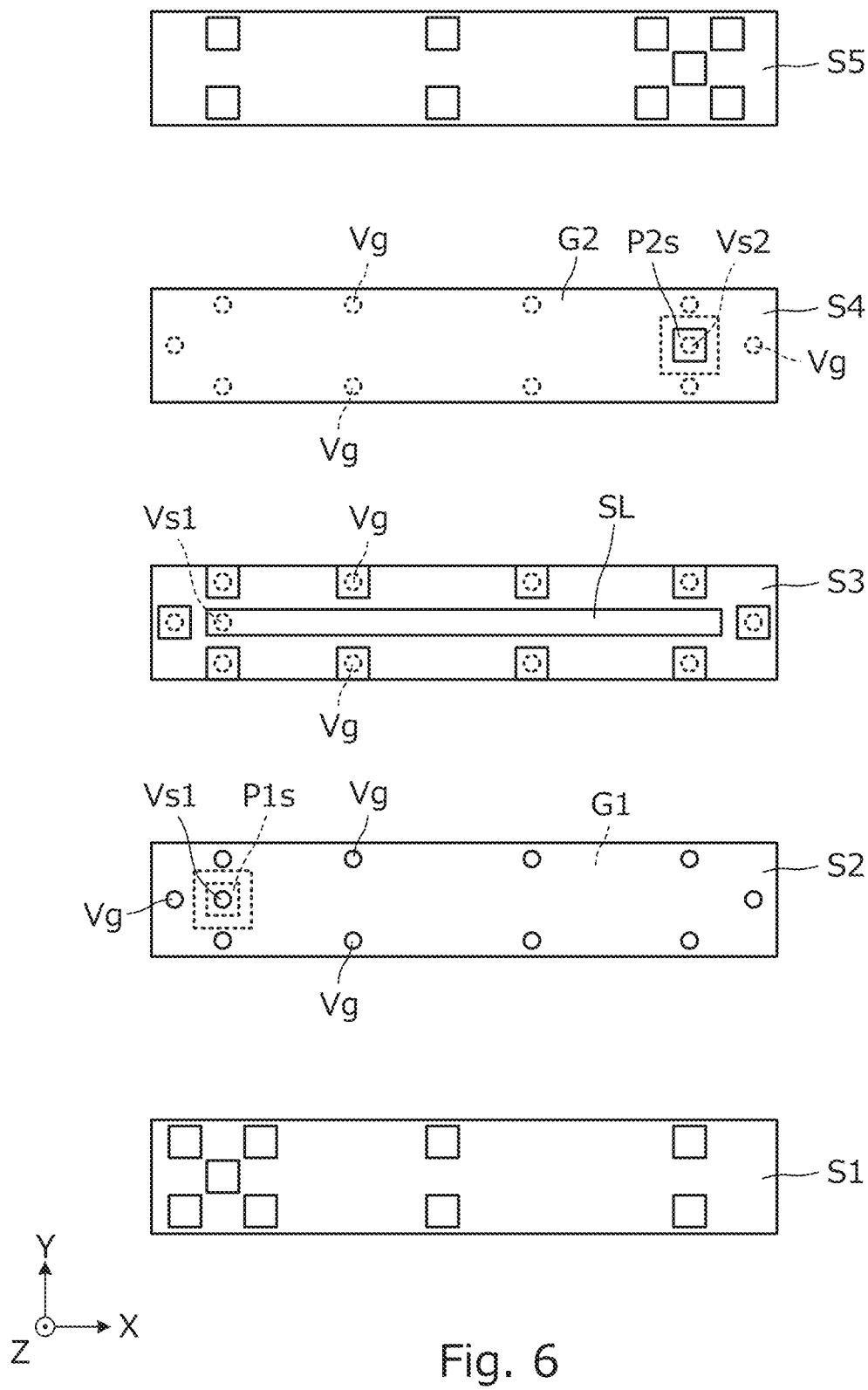
FIG. 6 is a plan view before lamination of each insulating base material layer that defines the interposer substrate 3.
Figure 7A:
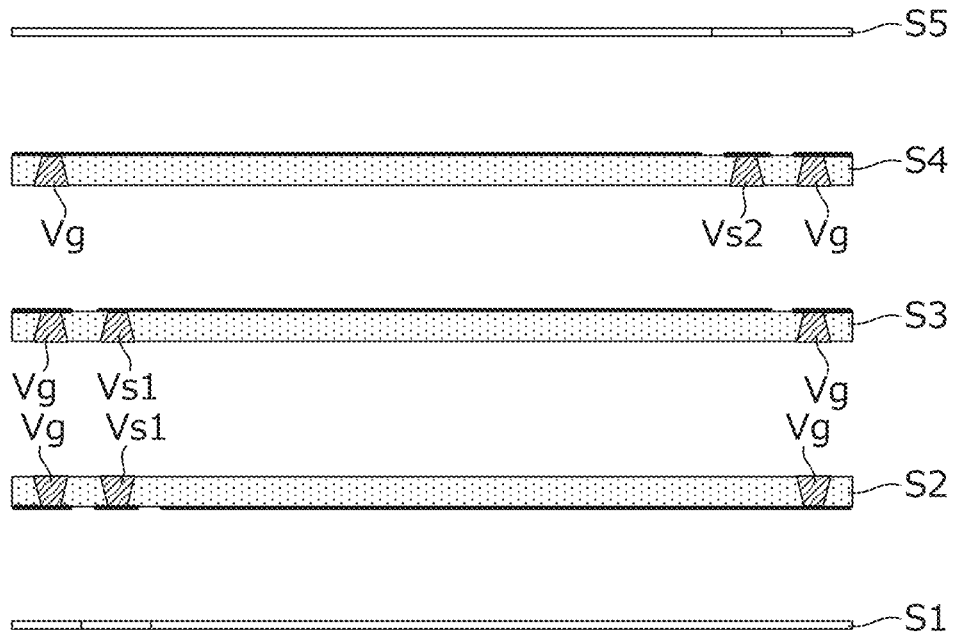
FIG. 7A is a cross-sectional view before lamination of each insulating base material layer that defines the interposer substrate 3.
Figure 7B:
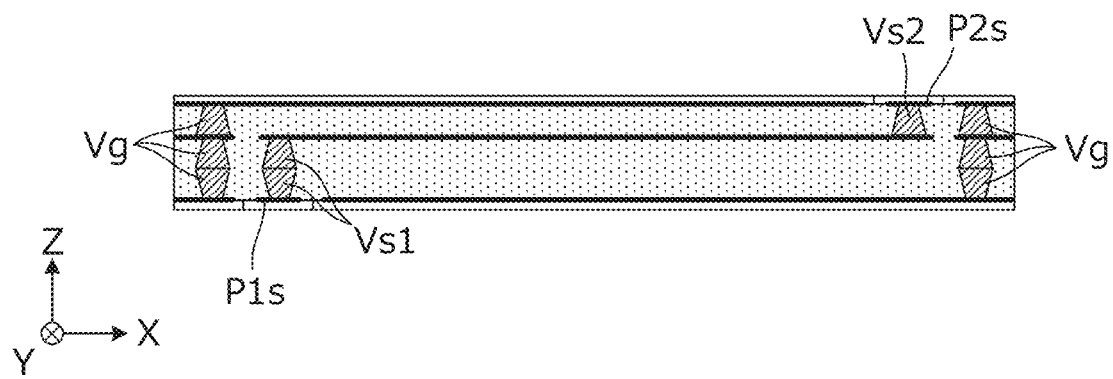
FIG. 7B is a cross-sectional view of the interposer substrate 3.

FIG. 6 is a plan view before lamination of each insulating base material layer that defines the interposer substrate 3. In addition, FIG. 7A is a cross-sectional view before lamination of each insulating base material layer that defines the interposer substrate 3, and FIG. 7B is a cross-sectional view of the interposer substrate 3.

A signal line SL including a first end and a second end is provided on a top surface of an insulating base material layer S3. A ground conductor G1 is provided on a bottom surface of an insulating base material layer S2, and a ground conductor G2 is provided on the top surface of an insulating base material layer S4. In addition, the electrode P1$s$ being a portion of the first input/output pad P1 is provided on the bottom surface of the insulating base material layer S2. Similarly, the electrode P2$s$ being a portion of the second input/output pad P2 is provided on the top surface of the insulating base material layer S4. An interlayer connection conductor Vs1 connected to the first end of the signal line SL is provided on the insulating base material layers S2 and S3, and an interlayer connection conductor Vs2 connected to the second end of the signal line SL is provided on the insulating base material layer S4. Furthermore, an interlayer connection conductor Vg connected to the ground conductors G1 and G2 is provided on the insulating base material layers S2, S3, and S4.

Insulating base material layers S1 and S5 that are shown in FIG. 6 are preferably solder resist films, for example, and are provided, for example, by printing on the front and back surfaces of a multilayer body including the insulating base material layers S2, S3, and S4. A plurality of opening portions that are provided on the insulating base material layer S1 define the first input/output pad P1 and the first auxiliary pad portions Pa11 and Pa12. In addition, a plurality of opening portions that are provided on the insulating base material layer S5 define the second input/output pad P2 and the second auxiliary pad portions Pa21 and Pa22.

The signal line SL and the ground conductors G1 and G2 are provided by patterning a metal foil, such as a copper foil, for example, attached to the insulator base material layers, by photolithography, for example. In addition, the interlayer connection conductors are provided by filling a metal material preferably including tin, for example, as a main component in a hole provided in the insulator base material layers.

A plating film, such as Ni/Au or Ni/Sn, for example, may preferably be applied on a surface of the electrodes P1$s$ and P2$s$.

In the manner described above, the interposer substrate 3 includes a transmission line of a stripline structure defined by the signal line SL and the ground conductors G1 and G2. The interlayer connection conductor Vg that is disposed in a side portion of the signal line SL and in the periphery of the interlayer connection conductors Vs1 and Vs2 defines and functions as a shield electrode.

The first circuit board 1 and the second circuit board 2 are preferably, glass epoxy substrates, and have an effective relative dielectric constant of about 4, for example. On the other hand, the insulating base material layers of the interposer substrate 3 are made of a liquid crystal polymer (LCP), and have an effective relative dielectric constant of about 3, for example. In addition, the interposer substrate 3 has a smaller effective elastic modulus than the first circuit board and the second circuit board, and is able to deform. For example, a Young's modulus of the glass epoxy substrates being the insulating base material layers of the first circuit board 1 and the second circuit board 2 is preferably about 25 GPa. On the other hand, a Young's modulus of the liquid crystal polymer (LCP) being the insulating base material layers of the interposer substrate 3 is preferably about 15 GPa, for example.

It is to be noted that, in the present invention, the "effective relative dielectric constant" and the "effective elastic modulus" are not limited to a "relative dielectric constant" and a "elastic modulus" of a single material but refer to a "relative dielectric constant" and a "elastic modulus" of a substrate including a composite material (a multilayer body including resin, a conductor pattern, an interlayer connection conductor, or an adhesive agent).

The first input/output land L1 of the first circuit board 1 shown in FIG. 3 includes five electrodes, for example, each of which is connected to the first input/output pad P1 (the electrode P1$s$ and the electrodes P1$g$) of the interposer substrate 3. Similarly, the second input/output land L2 of the second circuit board 2 shown in FIG. 2 includes five electrodes, for example, each of which is connected to the second input/output pad P2 (the electrode P2$s$ and the electrodes P2$g$) of the interposer substrate 3.

In the manner described above, a transmission line provided on the first circuit board 1 and a transmission line provided on the second circuit board 2 are connected through the transmission line of the interposer substrate 3.

In order to obtain the state showed in FIG. 4, the interposer substrate 3 is first attached to the second circuit board 2, and the second circuit board 2 with the interposer substrate 3 is mounted on the first circuit board 1. Alternatively, the interposer substrate 3 may be first mounted on the first circuit board 1, and the second circuit board 2 may be further mounted on the interposer substrate 3.

The interposer substrate 3 is preferably an electric element that has a flat or substantially flat shape and is able to deform. The interposer substrate 3 is picked up by a vacuum absorption chuck that includes a tip tool that includes an absorption surface of which the size is large enough to cover the entire or substantially the entire second principal surface of the interposer substrate 3.

When the interposer substrate 3 is mounted on the bottom surface of the second circuit board 2, cream solder, for example, is printed on each of the lands of the second circuit board 2, and the interposer substrate 3, as well as the components 5 (see FIG. 2), is mounted on the second circuit board 2. A melting point of the solder for mounting a component to this second circuit board is higher than a melting point of solder used for surface-mounting to the first circuit board 1. Subsequently, this second circuit board 2, by being passed through a reflow furnace, is soldered together with other components by a batch reflow soldering method, for example. Subsequently, the second circuit board 2 with the interposer substrate 3 is mounted on the top surface of the first circuit board 1 by a reflow soldering method, for example.

It is to be noted that the electrodes may be precoated with solder. As a result, the mounting capability is improved. In addition, with the use of both precoated solder and printed solder on the circuit board, the bonding strength is able to be further increased.

According to the first preferred embodiment, the following advantageous effects are obtained.

Since the interposer substrate 3 is connected and fixed to the first input/output land L1 and the first auxiliary land portions La11 and La12 of the first circuit board 1 through the first input/output pad P1 and the first auxiliary pad portions Pa11 and Pa12, the interposer substrate 3 capable of supporting the second circuit board 2 is easily and stably mounted on the first circuit board 1.

Since the plurality of first auxiliary pad portions Pa11 and Pa12 are disposed along the signal line SL, and the first auxiliary land portions La11 and La12 are disposed along the signal line SL, even when the interposer substrate 3 has an elongated shape, such an interposer substrate as well as other components are able to be solder-mounted on the first circuit board 1.

Since the plurality of first auxiliary pad portions Pa11 and Pa12 and the first input/output pad P1 are disposed at equal or substantially equal intervals, and the plurality of first auxiliary land portions La11 and La12 and the first input/output land L1 are disposed at equal or substantially equal intervals, the mounting capability of the interposer substrate 3 to the first circuit board 1 is improved, and the overall bonding strength is increased.

Since the interposer substrate 3 is connected and fixed to the second input/output land L2 and the second auxiliary land portions La21 and La22 of the second circuit board 2 through the second input/output pad P2 and the second auxiliary pad portions Pa21 and Pa22, the interposer substrate 3 and the second circuit board 2 are also able to be surface-mounted using solder, and the first circuit board 1 and the second circuit board 2 are able to be bonded only by the thickness of the interposer substrate 3 (with substantially no space), so that the first circuit board 1, the interposer substrate 3, and the second circuit board 2 are able to be disposed even in a small space in the electronic device. In addition, since space is hardly generated between the interposer substrate 3 and the second circuit board 2, as compared with a connection structure through a connector, the unnecessary radiation and energy loss due to leakage of electromagnetic waves are significantly reduced or prevented. Further, as compared with the connection structure through a connector, impedance mismatching hardly occurs and a return loss is also significantly reduced or prevented.

Since the plurality of second auxiliary pad portions Pa21 and Pa22 and the second input/output pad P2 are disposed at equal or substantially equal intervals, and the plurality of second auxiliary land portions La21 and La22 and the second input/output land L2 are disposed at equal or substantially equal intervals, even when the interposer substrate 3 has an elongated shape, such an interposer substrate as well as other components are able to be solder-mounted on the second circuit board 2. In addition, the mounting capability of the second circuit board 2 to the interposer substrate 3 is improved, and the overall bonding strength is increased.

Since the insulating base material layer of the interposer substrate 3 has a smaller effective relative dielectric constant than the insulating base material layer of the first circuit board 1 and the second circuit board 2, a capacitance component to be generated between the conductors in the interposer substrate 3 is able to be reduced, which enables a reduction in thickness of the interposer substrate 3. It is to be noted that a linear expansion coefficient of the circuit board on which components are mounted is preferably matched with a linear expansion coefficient of the components to be mounted, and a substrate, such as a glass epoxy substrate containing a filler such as glass fiber, for example, has been conventionally used. On the other hand, the interposer substrate 3 of the present preferred embodiment, since including less components than the first circuit board 1 or the second circuit board 2, does not have such restrictions, so that the interposer substrate 3 of which the effective relative dielectric constant is smaller than the effective relative dielectric constant of the first circuit board 1 and the second circuit board 2 is able to be used.

Since the interposer substrate 3 has a smaller effective elastic modulus than the first circuit board 1 and the second circuit board 2 and is able to deform, the degree of freedom in the shape of the interposer substrate 3 is increased, and the interposer substrate 3 is also able to be mounted in a place with a level difference in a height direction, for example. In addition, the interposer substrate 3 is also able to be curved in a plane direction. In addition, since the interposer substrate 3 has higher flexibility than the first circuit board 1 and the second circuit board 2, damage of a bonding portion (a bonding portion between the first input/output pad P1 and the first input/output land L1, a bonding portion between the second input/output pad P2 and the second input/output land L2, a bonding portion between the first auxiliary pad portions Pa11 and Pa12 and the first auxiliary land portions La11 and La12, and a bonding portion between the second auxiliary pad portions Pa21 and Pa22 and the second auxiliary land portions La21 and La22) due to stress applied to the first circuit board 1 or the second circuit board 2 is significantly reduced or prevented.

Since the interposer substrate 3 includes a multilayer body including a plurality of insulating base material layers that include an insulating base material layer on which a conductor pattern is provided, the degree of integration of the conductor patterns in the interposer substrate 3 is increased, and even a small interposer substrate enables the wiring between the first circuit board 1 and the second circuit board 2.

Since the interposer substrate 3 includes ground conductors G1 and G2 that are provided on a plurality of insulating base material layers, and the ground conductors G1 and G2, the signal line SL, and an insulating base material layer between the ground conductors G1 and G2 and the signal line SL define a stripline, the stripline is able to be used as a transmission line that is independent in the interposer substrate 3 and has less unnecessary radiation, and mutual interference between this transmission line and the circuit of the first circuit board 1 and the second circuit board 2 is significantly reduced or prevented.

Since the interposer substrate 3 includes a plurality of interlayer connection conductors Vg that connect, at a plurality of positions, the ground conductors G1 and G2 that are provided on different insulating base material layers of the stripline, unnecessary radiation to the lateral side of the stripline is also significantly reduced or prevented.

Since the first auxiliary pad portions Pa11 and Pa12 and the second auxiliary pad portions Pa21 and Pa22 are each electrically connected to the ground conductors of the interposer substrate 3, and the first auxiliary land portions La11 and La12 and the second auxiliary land portions La21 and La22 are electrically connected to ground conductors on the side of the first circuit board 1 and the second circuit board 2, the potential (ground potential) of the ground conductors of the interposer substrate 3 is stabilized, and generation of common mode noise and unnecessary radiation are significantly reduced or prevented. In addition, since the ground conductors of the first circuit board 1 and the second circuit board 2 are connected to each other at a plurality of positions, the ground potential of the first circuit board 1 and the second circuit board 2 is stabilized, and the generation of common mode noise and unnecessary radiation are significantly reduced or prevented.

Second Preferred Embodiment

In a second preferred embodiment of the present invention, a description is provided of an example of an interposer substrate 3 with a shape that is different from the shape that has been described in the first preferred embodiment.

Figure 8:
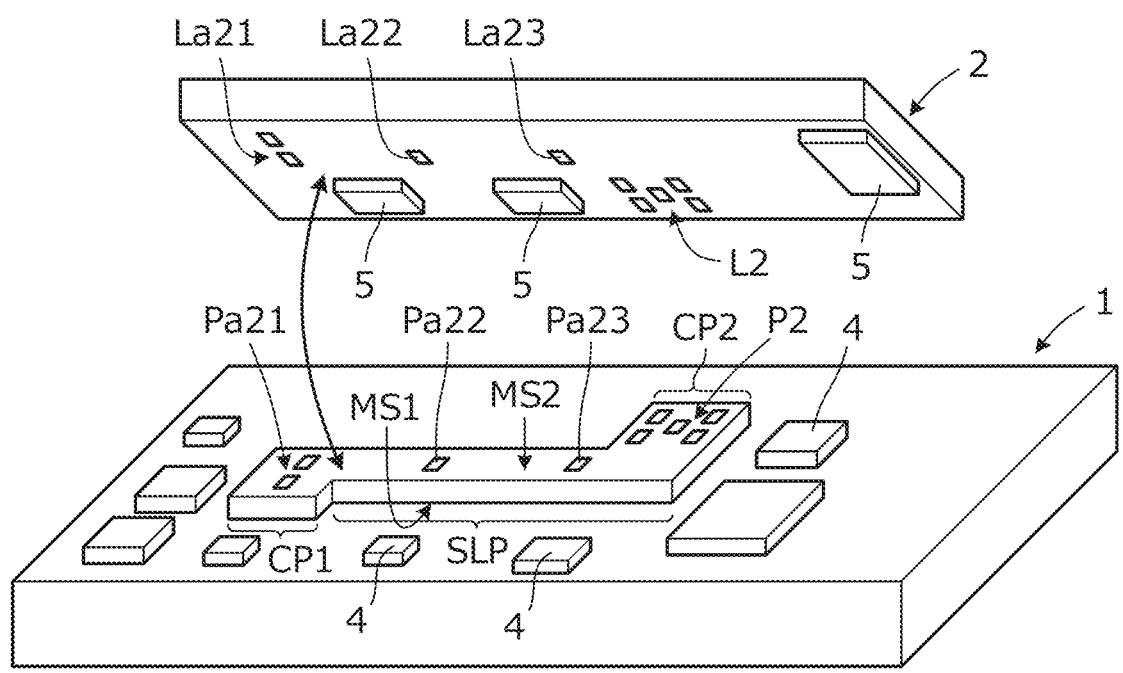
FIG. 8 is an exploded perspective view of a main portion of an electronic device according to a second preferred embodiment of the present invention.

FIG. 8 is an exploded perspective view of a main portion of an electronic device according to the second preferred embodiment of the present invention. FIG. 8 is a perspective view in a state in which the interposer substrate 3 is mounted on the first circuit board 1, and the second circuit board 2 is tilted to make a bottom surface of the second circuit board 2 visible.

Similarly to the first preferred embodiment, the electronic device includes a first circuit board 1, a second circuit board 2, and an interposer substrate 3. The entirety or substantially the entirety of the interposer substrate 3 is interposed between the first circuit board 1 and the second circuit board 2.

The interposer substrate 3 includes a first principal surface MS1 and a second principal surface MS2, and the first principal surface MS1 faces the first circuit board 1 and the second principal surface MS2 faces the second circuit board 2.

The interposer substrate 3 includes a first connection portion CP1 that includes the first input/output pad P1 on the first principal surface MS1, and a second connection portion CP2 that includes the second input/output pad P2 on the second principal surface MS2. The interposer substrate 3 also includes a line portion SLP that is provided between the first connection portion CP1 and the second connection portion CP2 and has a smaller width than the first connection portion CP1 and the second connection portion CP2.

It is to be noted that, in the second preferred embodiment, second auxiliary pad portions Pa21, Pa22, and Pa23 are provided in three positions on the second principal surface MS2 of the interposer substrate 3. The second auxiliary pad portions Pa21, Pa22, Pa23 and the second input/output pad P2 are preferably disposed at equal or substantially equal intervals.

Other configurations are preferably the same or substantially the same as the configurations described in the first preferred embodiment.

According to the second preferred embodiment, since the interposer substrate 3 includes a first connection portion CP1 that includes the first input/output pad P1, a second connection portion CP2 that includes the second input/output pad P2, and a line portion SLP that is provided between the first connection portion CP1 and the second connection portion CP2 and has a smaller width than the first connection portion CP1 and the second connection portion CP2, the occupation area of the interposer substrate 3 is reduced, and the mounting space of a component and the wiring space of the first circuit board 1 or the second circuit board 2 are easily secured.

Third Preferred Embodiment

In a third preferred embodiment of the present invention, a description is provided of an example of an interposer substrate 3 with a shape that is different from the shape that has been described in the second preferred embodiment.

Figure 9:
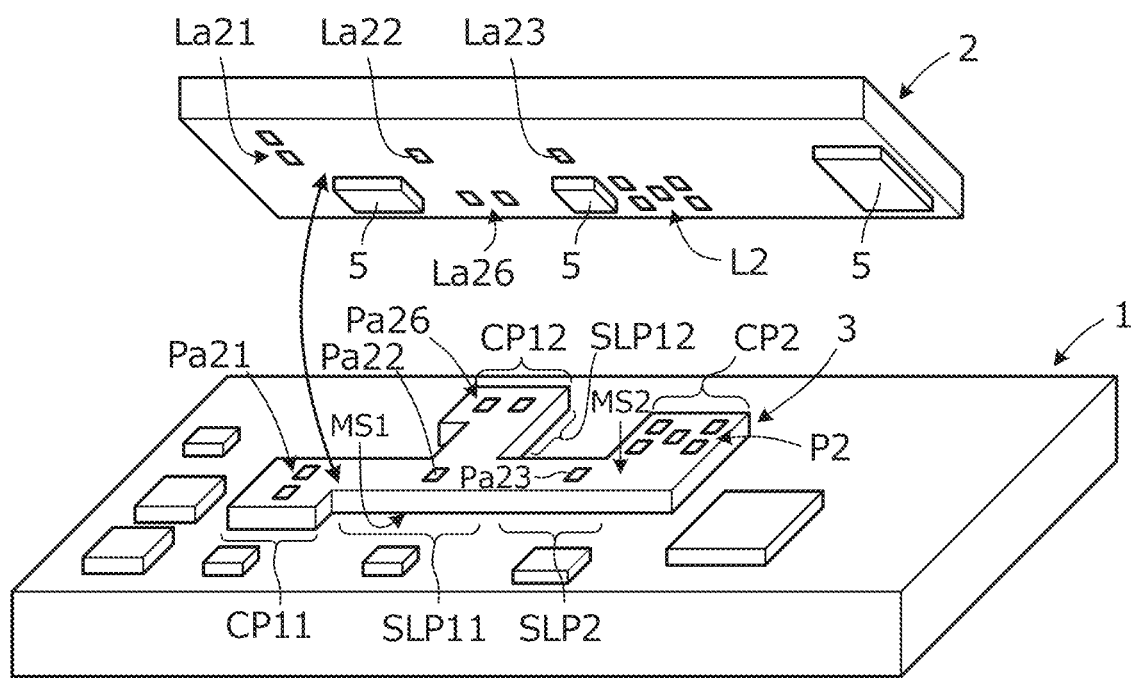
FIG. 9 is an exploded perspective view of a main portion of an electronic device according to a third preferred embodiment of the present invention.

FIG. 9 is an exploded perspective view of a main portion of an electronic device according to the third preferred embodiment of the present invention. FIG. 9 is a perspective view in a state in which the interposer substrate 3 is mounted on the first circuit board 1, and the second circuit board 2 is tilted to make a bottom surface of the second circuit board 2 visible.

Similarly to the first preferred embodiment, the electronic device includes a first circuit board 1, a second circuit board 2, and an interposer substrate 3. The entirety or substantially the entirety of the interposer substrate 3 is interposed between the first circuit board 1 and the second circuit board 2.

The interposer substrate 3 includes a first principal surface MS1 and a second principal surface MS2, and the first principal surface MS1 faces the first circuit board 1 and the second principal surface MS2 faces the second circuit board 2.

In the third preferred embodiment, the interposer substrate 3 includes two first connection portions CP11 and CP12, and one second connection portion CP2. Each of the first connection portions CP11 and CP12 on the first principal surface MS1 of the interposer substrate 3 includes a first input/output pad, and the second connection portion CP2 on the second principal surface MS2 includes a second input/output pad P2.

In addition, the interposer substrate 3 includes line portions SLP11, SLP12, and SLP2 that are provided between the first connection portions CP11 and CP12 and the second connection portion CP2 and have a smaller width than the first connection portions CP11 and CP12 and the second connection portion CP2.

Other configurations are preferably the same or substantially the same as the configurations described in the first and second preferred embodiments. As described above, the number of the input/output pads and the connection portions that include the input/output pads may be three or more.

Figure 10A:
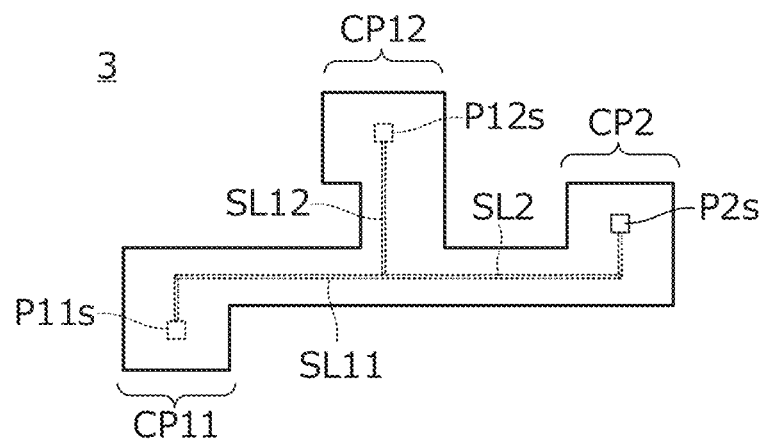
FIGS. 10A and 10B are plan views showing a configuration of a signal line in the interposer substrate 3 according to the third preferred embodiment and an electrode that is connected to the signal line.
Figure 10B:
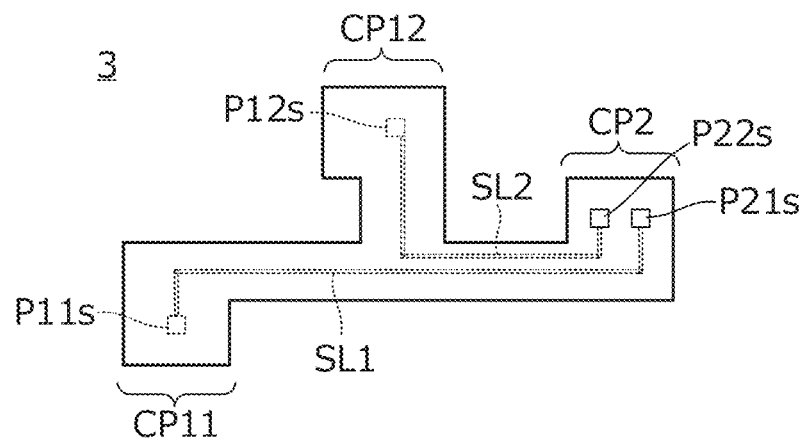

FIGS. 10A and 10B are plan views showing a configuration of a signal line in the interposer substrate 3 according to the third preferred embodiment and an electrode that is connected to the signal line. In FIGS. 10A and 10B, a ground electrode is not shown.

In the example shown in FIG. 10A, the first connection portions CP11 and CP12 include electrodes P11s and P12s, and the second connection portion CP2 includes an electrode P2s. Signal lines SL11 and SL12 are provided between the electrode P11s and the electrode P12s, and a signal line SL2 is provided between a connection point of the signal lines SL11 and SL12 and the electrode P2s. In this manner, the interposer substrate that includes three connection portions and branched signal lines is able to be provided.

In the example shown in FIG. 10B, the first connection portions CP11 and CP12 include electrodes P11s and P12s, and the second connection portion CP2 includes electrodes P21s and P22s. A signal line SL1 is provided between the electrode P11s and the electrode P21s, and a signal line SL2 is provided between the electrode P12s and the electrode P22s. In this manner, the interposer substrate that includes three connection portions and two signal lines is able to be provided.

The branching interposer substrate shown in FIG. 10A may include a frequency filter and may provide a branching filter, such as a duplexer and a diplexer, for example.

It is to be noted that, while, in the example shown in FIG. 9, the two first connection portions CP11 and CP12 and one second connection portion CP2 are provided, similarly, one first connection portion and two second connection portions are able to be provided.

Fourth Preferred Embodiment

In a fourth preferred embodiment of the present invention, a description is provided of an example of an interposer substrate 3 with a shape that is different from the shape that has been described in the first preferred embodiment.

Figure 11:
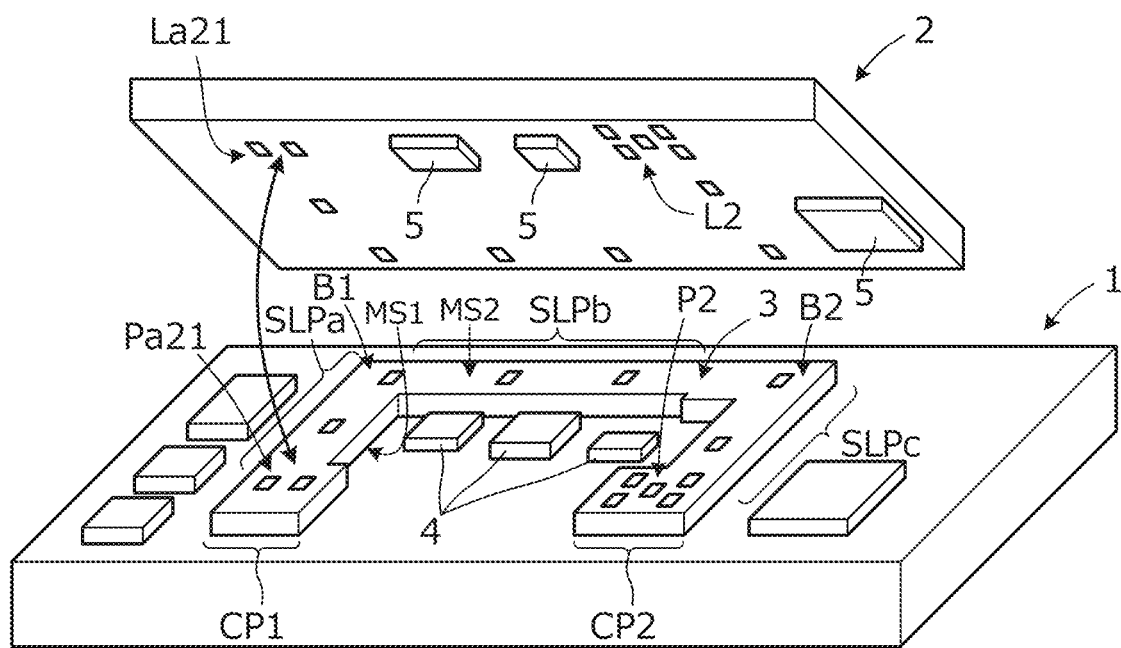
FIG. 11 is an exploded perspective view of a main portion of an electronic device according to a fourth preferred embodiment of the present invention.
Figure 12A:
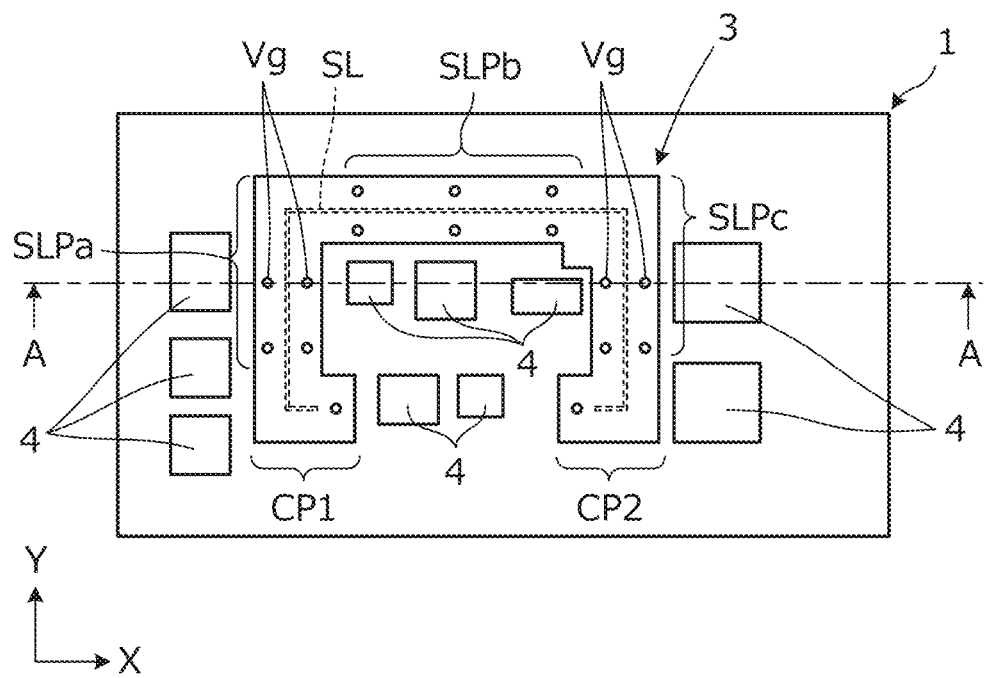
FIG. 12A is a plan view in a state in which an interposer substrate 3 is mounted on a first circuit board 1 according to the fourth preferred embodiment of the present invention.

FIG. 11 is an exploded perspective view of a main portion of an electronic device according to the fourth preferred embodiment of the present invention. FIG. 11 is a perspective view in a state in which an interposer substrate 3 is mounted on a first circuit board 1, and a second circuit board 2 is tilted to make a bottom surface of the second circuit board 2 visible. FIG. 12A is a plan view in a state in which the interposer substrate 3 is mounted on the first circuit board 1 according to the fourth preferred embodiment, and FIG. 12B is a cross-sectional view of an A-A portion of FIG. 12A.

As with the example shown in FIG. 8, the interposer substrate 3 according to the fourth preferred embodiment also includes a first connection portion CP1 that includes the first input/output pad on the first principal surface MS1, and a second connection portion CP2 that includes the second input/output pad P2 on the second principal surface MS2. In addition, the interposer substrate 3 also includes line portions SLPa, SLPb, and SLPc that are provided between the first connection portion CP1 and the second connection portion CP2 and have a smaller width than the first connection portion CP1 and the second connection portion CP2. In the fourth preferred embodiment, a line portion including the line portions SLPa, SLPb, and SLPc includes bent portions B1 and B2, and the line portions SLPa, SLPb, and SLPc preferably define three sides of a quadrangle. The line portion including the line portions SLPa, SLPb, and SLPc is provided in a frame shape so as to avoid the components 4 that are provided on the first circuit board 1 and the components 5 that are provided on the second circuit board 2.

In addition, the second auxiliary pad portions are provided at a plurality of positions on the second principal surface MS2 of the interposer substrate 3, and the second auxiliary pad portions and the second input/output pad P2 are preferably disposed at equal or substantially equal intervals along the line portion including the line portions SLPa, SLPb, and SLPc. The first auxiliary pad portions are provided at a plurality of positions on the first principal surface MS1 of the interposer substrate 3, and the first auxiliary pad portions and the first input/output pad are preferably disposed at equal or substantially equal intervals along the line portion including the line portions SLPa, SLPb, and SLPc.

Figure 12B:
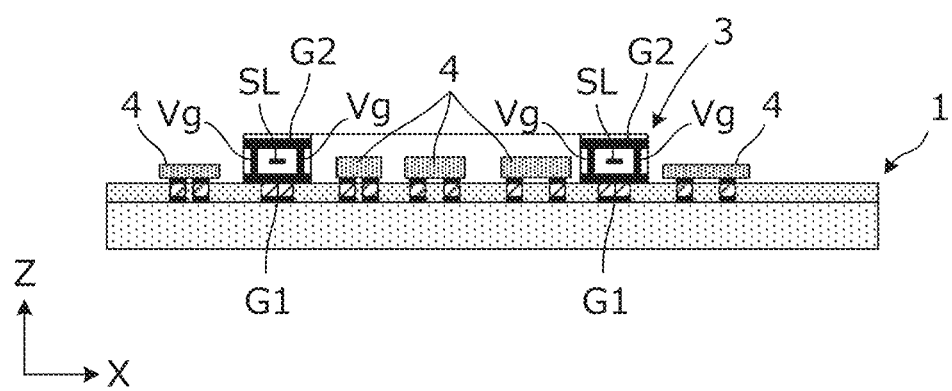
FIG. 12B is a cross-sectional view of an A-A portion of FIG. 12A.

As shown in FIGS. 12A and 12B, a plurality of interlayer connection conductors Vg that are electrically connected to the upper and lower ground conductors G1 and G2 are provided on both sides of the signal line SL at a predetermined spacing. The spacing between the plurality of interlayer connection conductors Vg is preferably within about half the wavelength of the frequency band of a transmission signal, for example. Therefore, the interlayer connection conductors Vg define and function as shield electrodes. With the above structure, the unnecessary coupling between the components 4 on the inside or the outside of the frame-shaped interposer substrate 3 and the signal lines of the interposer substrate 3 is prevented, and the components 4 on the inside and outside of the interposer substrate 3 are shielded from each other.

It is to be noted that the interlayer connection conductors Vg may be provided on a lateral surface of the multilayer body with the plating film or the like. Accordingly, shielding in a planar shape is enabled.

In this manner, the shield electrode that extends in a thickness direction is provided, so that propagation of noise is able to be significantly reduced or prevented. In addition, in order to isolate components that easily propagate noise, or vice versa, components that are susceptible to noise, the interposer substrate 3 is also able to be disposed so as to surround such components.

Figure 13:
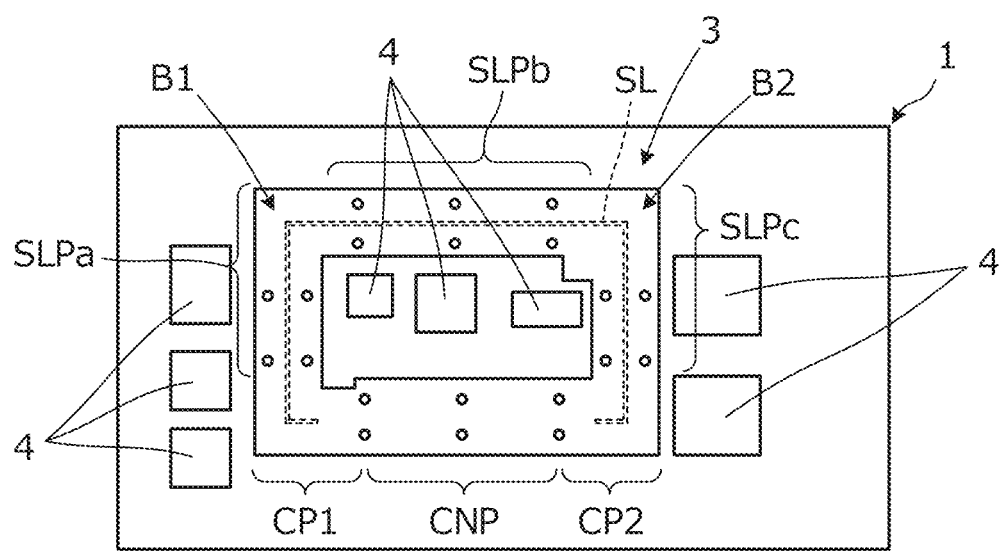
FIG. 13 is a plan view showing a relationship between a first circuit board 1 and an interposer substrate 3 in another electronic device according to the fourth preferred embodiment of the present invention.

FIG. 13 is a plan view showing a relationship between a first circuit board 1 and an interposer substrate 3 in another electronic device according to the fourth preferred embodiment. In this example, the line portion including the line portions SLPa, SLPb, and SLPc includes bent portions B1 and B2, and a coupling portion CNP that couples between the first connection portion CP1 and the second connection portion CP2 is provided. In addition, the line portions SLPa, SLPb, and SLPc and the coupling portion CNP are provided so as to avoid the components 4 that are provided on the first circuit board 1. According to this structure, the interposer substrate 3 preferably has a quadrangular shape in a plan view.

According to the fourth preferred embodiment, since the interposer substrate 3 includes the bent portions B1 and B2 so as to avoid the components 4 that are provided on the first circuit board 1 and the components 5 that are provided on the second circuit board 2, the effective occupation area of the interposer substrate 3 is reduced, and the mounting space of a component and the wiring space of the first circuit board 1 or the second circuit board 2 are easily secured. In addition, the interposer substrate 3 has a quadrangular shape in schematic outer shape, and at least three sides of the quadrangular shape are interposed between the first circuit board 1 and the second circuit board 2, so that the structure supporting the second circuit board 2 by the interposer substrate 3 may be stabilized. In particular, in the example shown in FIG. 13, the interposer substrate 3 is annularly connected, and the first circuit board 1 and the second circuit board 2 are more stably connected over four sides through the interposer substrate 3.

Fifth Preferred Embodiment

In a fifth preferred embodiment of the present invention, a description is provided of an electronic device that includes an interposer substrate that includes an auxiliary connection portion.

Figure 14A:
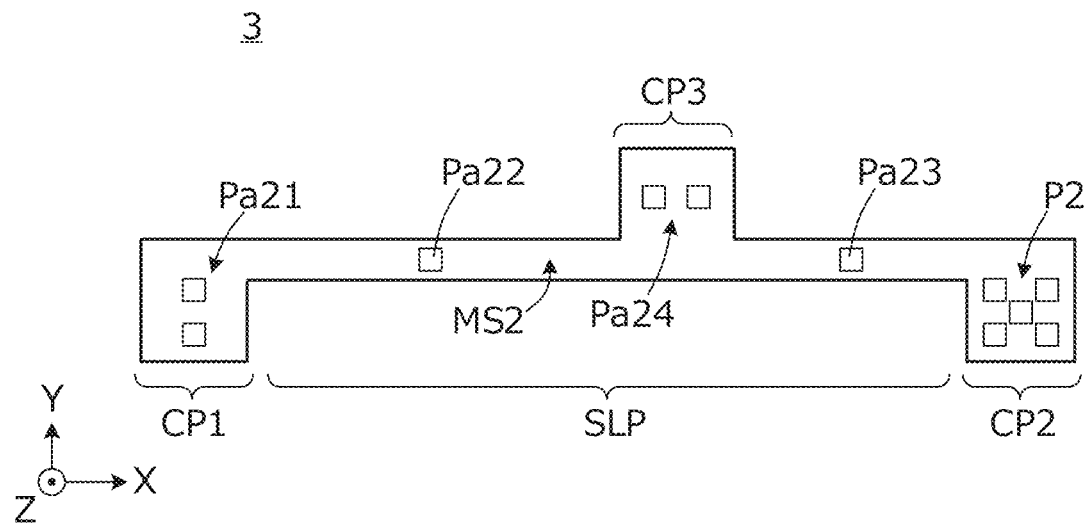
FIG. 14A is a plan view of an interposer substrate 3 according to a fifth preferred embodiment of the present invention.
Figure 14B:
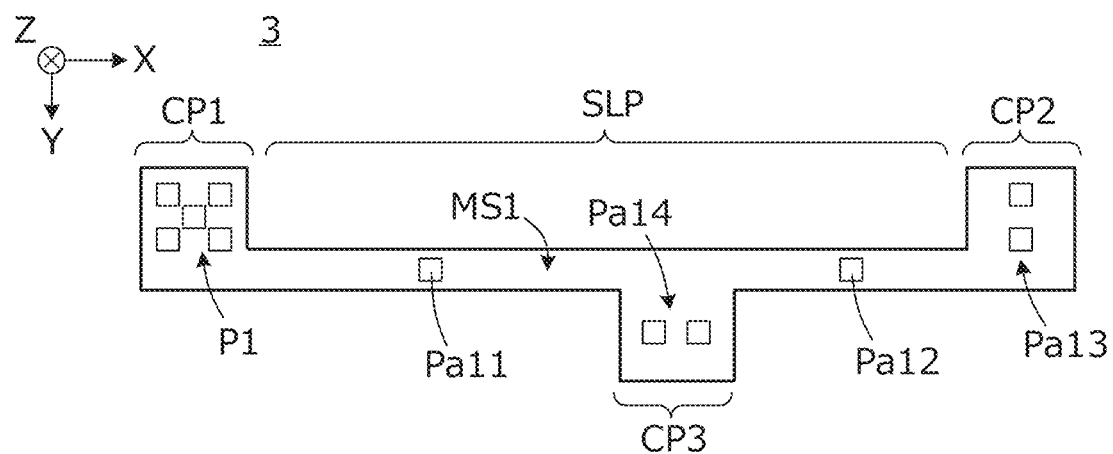
FIG. 14B is a bottom view of the interposer substrate 3.

FIG. 14A is a plan view of an interposer substrate 3 according to the fifth preferred embodiment of the present invention, and FIG. 14B is a bottom view of the interposer substrate 3.

A first input/output pad P1 and first auxiliary pad portions Pa11, Pa12, Pa13, and Pa14 are provided on the first principal surface MS1 of the interposer substrate 3 of the fifth preferred embodiment. The interposer substrate 3 also includes a line portion SLP that is provided between the first connection portion CP1 and the second connection portion CP2 and has a smaller width than the first connection portion CP1 and the second connection portion CP2.

In the fifth preferred embodiment, in particular, an auxiliary connection portion CP3 is provided in a middle region of the line portion SLP of the interposer substrate 3. An input/output pad is not provided in the auxiliary connection portion CP3. A first auxiliary pad portion Pa14 is provided on the first principal surface MS1 of the auxiliary connection portion CP3, and a second auxiliary pad portion Pa24 is provided on the second principal surface MS2 of the auxiliary connection portion CP3.

As with the preferred embodiments described above, the interposer substrate 3 is disposed between a first circuit board and a second circuit board. A first auxiliary land is provided in a position opposed to each of the first auxiliary pad portions Pa11, Pa12, Pa13, and Pa14, and a second auxiliary land is provided in a position opposed to each of the second auxiliary pad portions Pa21, Pa22, Pa23, and Pa24.

As shown in the fifth preferred embodiment, the interposer substrate 3 may include a connection portion that does not include an input/output pad. According to the fifth preferred embodiment, even when the line portion is long, the mounting capability of the interposer substrate 3 to the first circuit board and the second circuit board is improved, and the overall bonding strength is increased.

Sixth Preferred Embodiment

In a sixth preferred embodiment of the present invention, a description is provided of an electronic device that includes an interposer substrate that is different in a configuration of a signal line from the interposer described in the previous preferred embodiments.

Figure 15A:
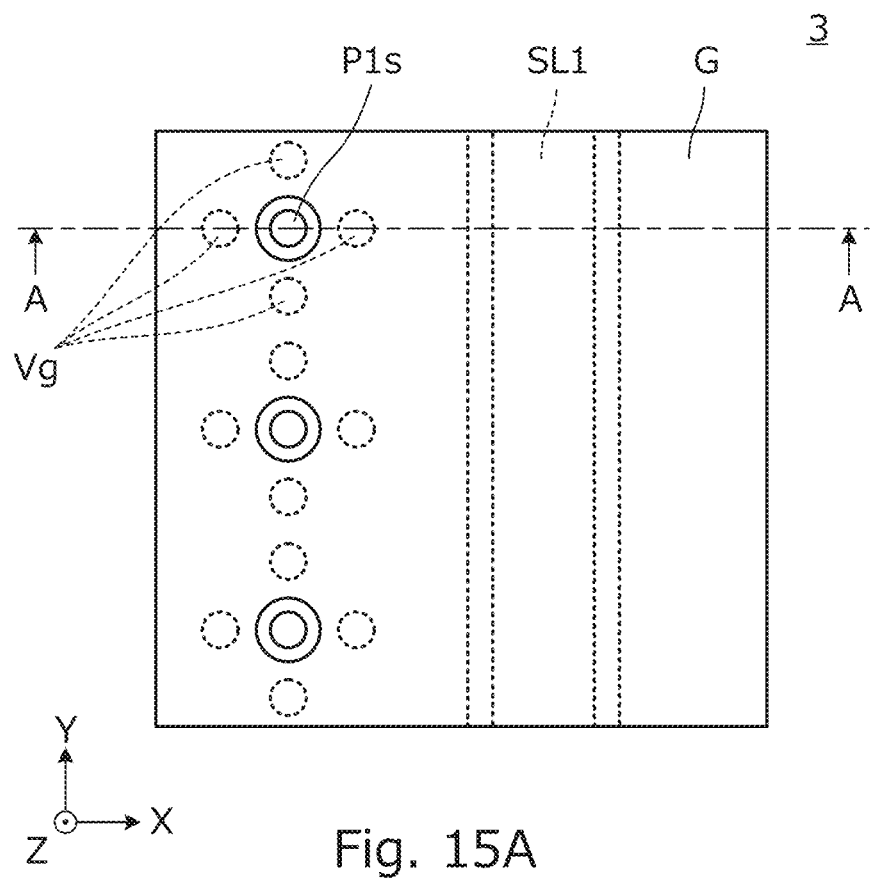
FIG. 15A is a plan view of an interposer substrate 3 according to a sixth preferred embodiment of the present invention.
Figure 15B:
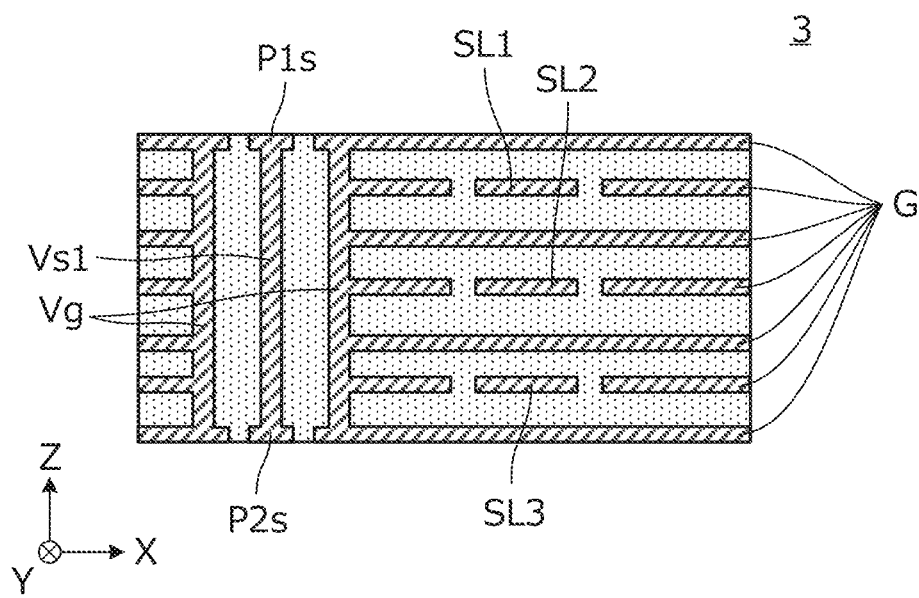
FIG. 15B is a cross-sectional view of an A-A portion of FIG. 15A.

FIG. 15A is a plan view of an interposer substrate 3 according to the sixth preferred embodiment of the present invention, and FIG. 15B is a cross-sectional view of an A-A portion of FIG. 15A.

The interposer substrate 3 of the sixth preferred embodiment is a multilayer body including a plurality of insulating base material layers on which various conductor patterns are provided. In this example, three signal lines SL1, SL2, and SL3 and a ground conductor G that is provided on both sides and on the top and bottom of the signal lines define three grounded coplanar lines that extend in the Y axis direction. In addition, the interlayer connection conductor Vs1 for a signal line and the interlayer connection conductors Vg for ground conductors, the interlayer connection conductors extending in the stacking direction, define a coaxial line that extends in the Z axis direction.

As shown in the sixth preferred embodiment, the interposer substrate 3 may include a signal line that passes through different height positions in the stacking direction. In addition, a signal line that extends in the stacking direction may be provided.

While an example in which the interposer substrate 3 and the second circuit board 2 are directly connected through solder is mainly shown in FIG. 2, FIG. 8, FIG. 9, and FIG. 11, the interposer substrate 3 and the second circuit board 2 may be connected through a connector. For example, a plug is mounted on the second principal surface MS2 of the interposer substrate 3, a receptacle is mounted on the bottom surface of the second circuit board 2, and the interposer substrate 3 and the second circuit board 2 may be electrically and mechanically connected to each other by fitting of the plug and the receptacle.

In addition, various components may be embedded in the interposer substrate 3.

The interposer substrate 3 may include a frequency filter, such as a low pass filter, a high pass filter, a band pass filter, or a band elimination filter (a trap filter), for example, even for a single signal line.

In addition, the interposer substrate 3 may include an element, such as an inductor or a capacitor, for example, in addition to the signal line.

In a case in which the interposer substrates 3 includes a resin multilayer substrate, each insulating base material layer may preferably include a thermoplastic resin, such as a polyimide (PI) or a polyether ether ketone (PEEK), for example. In addition, the thermoplastic resin sheets are not limited to sheets of which the surfaces are fused by collectively stacking respective sheets and heating and pressing the sheets and may include an adhesive layer between respective sheets.

In addition, the interposer substrate 3 may include a composite material including a plurality of resin materials. For example, the interposer substrate 3 may be a multilayer body including a thermosetting resin, such as a glass epoxy substrate and a thermoplastic resin, for example.

In addition, the insulating base material layers of the interposer substrate 3 are not limited to a resin multilayer substrate including laminated resin sheets but may include a ceramic multilayer substrate.

While FIGS. 12A, 12B, and FIG. 13 show an example in which the single interposer substrate 3 is mounted on the first circuit board 1, a plurality of interposer substrates may be disposed in a frame shape, on the first circuit board 1. As a result, the same or substantially the same advantageous operational effects as the advantageous operational effects described in the fourth preferred embodiment are able to be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
   a first circuit board;
   a second circuit board; and
   an interposer substrate including a first principal surface and a second principal surface and being entirely or substantially entirely interposed between the first circuit board and the second circuit board; wherein
   the first principal surface of the interposer substrate faces the first circuit board;
   the second principal surface of the interposer substrate faces the second circuit board;
   the interposer substrate includes:
      a signal line including a first end and a second end;
      a first input/output pad provided on the first principal surface and including:

a first electrode electrically connected to the first end of the signal line; and
a second electrode electrically connected to a ground conductor;
a second input/output pad provided on the second principal surface and including:
a third electrode electrically connected to the second end of the signal line; and
a fourth electrode electrically connected to a ground conductor; and
a first auxiliary pad provided on the first principal surface and between the first input/output pad and the second input/output pad in an extending direction of the signal line;
the first circuit board, on a surface thereof that faces the interposer substrate, includes:
a first input/output land connected to the first input/output pad; and
a first auxiliary land connected to the first auxiliary pad;
the first input/output pad and the first auxiliary pad are respectively directly soldered to the first input/output land and the first auxiliary land of the first circuit board, and the interposer substrate and the first circuit board are electrically connected to each other;
the second circuit board is electrically connected to the interposer substrate through the second input/output pad;
the first auxiliary pad includes a plurality of first auxiliary pad portions; and
the first auxiliary land includes a plurality of first auxiliary land portions.

2. The electronic device according to claim 1, wherein
the plurality of first auxiliary pad portions and the first input/output pad are disposed at equal or substantially equal intervals; and
the plurality of first auxiliary land portions and the first input/output land are disposed at equal or substantially equal intervals.

3. The electronic device according to claim 1, wherein
the interposer substrate includes a second auxiliary pad provided on the second principal surface and between the first input/output pad and the second input/output pad in the extending direction of the signal line;
the second circuit board, on a surface thereof that faces the interposer substrate, includes:
a second input/output land connected to the second input/output pad; and
a second auxiliary land connected to the second auxiliary pad; and
the second input/output pad and the second auxiliary pad are respectively directly soldered to the second input/output land and the second auxiliary land of the second circuit board, and the interposer substrate and the second circuit board are electrically connected to each other.

4. The electronic device according to claim 1, wherein the interposer substrate includes an insulating base material layer that has a smaller effective relative dielectric constant than the first circuit board and the second circuit board.

5. The electronic device according to claim 1, wherein the interposer substrate includes an insulating base material layer that has a smaller effective elastic modulus than the first circuit board and the second circuit board.

6. The electronic device according to claim 1, wherein the interposer substrate includes a bent portion that bends so as to avoid a component that is mounted on at least one of the first circuit board and the second circuit board.

7. The electronic device according to claim 1, wherein the interposer substrate surrounds a component that is mounted on at least one of the first circuit board and the second circuit board.

8. An electronic device comprising:
a first circuit board;
a second circuit board; and
an interposer substrate including a first principal surface and a second principal surface and being entirely or substantially entirely interposed between the first circuit board and the second circuit board; wherein
the first principal surface of the interposer substrate faces the first circuit board;
the second principal surface of the interposer substrate faces the second circuit board;
the interposer substrate includes:
a signal line including a first end and a second end;
a first input/output pad provided on the first principal surface and including:
a first electrode electrically connected to the first end of the signal line; and
a second electrode electrically connected to a ground conductor;
a second input/output pad provided on the second principal surface and including:
a third electrode electrically connected to the second end of the signal line; and
a fourth electrode electrically connected to a ground electrode; and
a first auxiliary pad provided on the first principal surface and between the first input/output pad and the second input/output pad in an extending direction of the signal line;
the first circuit board, on a surface thereof that faces the interposer substrate, includes:
a first input/output land connected to the first input/output pad; and
a first auxiliary land connected to the first auxiliary pad;
the first input/output pad and the first auxiliary pad are respectively directly soldered to the first input/output land and the first auxiliary land of the first circuit board, and the interposer substrate and the first circuit board are electrically connected to each other;
the second circuit board is electrically connected to the interposer substrate through the second input/output pad;
the interposer substrate includes a second auxiliary pad provided on the second principal surface and between the first input/output pad and the second input/output pad in the extending direction of the signal line;
the second circuit board, on a surface thereof that faces the interposer substrate, includes:
a second input/output land connected to the second input/output pad; and
a second auxiliary land connected to the second auxiliary pad;
the second input/output pad and the second auxiliary pad are respectively directly soldered to the second input/output land and the second auxiliary land of the second circuit board, and the interposer substrate and the second circuit board are electrically connected to each other;
the second auxiliary pad includes a plurality of second auxiliary pad portions; and
the second auxiliary land includes a plurality of second auxiliary land portions.

9. The electronic device according to claim 8, wherein
the plurality of second auxiliary pad portions and the second input/output pad are disposed at equal or substantially equal intervals; and
the plurality of second auxiliary land portions and the second input/output land are disposed at equal or substantially equal intervals.

10. The electronic device according to claim 8, wherein the interposer substrate includes an insulating base material layer that has a smaller effective relative dielectric constant than the first circuit board and the second circuit board.

11. The electronic device according to claim 8, wherein the interposer substrate includes an insulating base material layer that has a smaller effective elastic modulus than the first circuit board and the second circuit board.

12. The electronic device according to claim 8, wherein the interposer substrate includes a bent portion that bends so as to avoid a component that is mounted on at least one of the first circuit board and the second circuit board.

13. The electronic device according to claim 8, wherein the interposer substrate surrounds a component that is mounted on at least one of the first circuit board and the second circuit board.

14. An electronic device comprising:
a first circuit board;
a second circuit board; and
an interposer substrate including a first principal surface and a second principal surface and being entirely or substantially entirely interposed between the first circuit board and the second circuit board; wherein
the first principal surface of the interposer substrate faces the first circuit board;
the second principal surface of the interposer substrate faces the second circuit board;
the interposer substrate includes:
a signal line including a first end and a second end;
a first input/output pad provided on the first principal surface and including:
a first electrode electrically connected to the first end of the signal line; and
a second electrode electrically connected to a ground conductor;
a second input/output pad provided on the second principal surface and including:
a third electrode electrically connected to the second end of the signal line; and
a fourth electrode electrically connected to a ground conductor; and
a first auxiliary pad provided on the first principal surface and between the first input/output pad and the second input/output pad in an extending direction of the signal line;
the first circuit board, on a surface thereof that faces the interposer substrate, includes:
a first input/output land connected to the first input/output pad; and
a first auxiliary land connected to the first auxiliary pad;
the first input/output pad and the first auxiliary pad are respectively directly soldered to the first input/output land and the first auxiliary land of the first circuit board, and the interposer substrate and the first circuit board are electrically connected to each other;
the second circuit board is electrically connected to the interposer substrate through the second input/output pad; and the interposer substrate includes:
a first connection portion including the first input/output pad;
a second connection portion including the second input/output pad; and
a line portion provided between the first connection portion and the second connection portion and having a smaller width than the first connection portion and the second connection portion.

15. The electronic device according to claim 14, wherein the interposer substrate includes an insulating base material layer that has a smaller effective relative dielectric constant than the first circuit board and the second circuit board.

16. The electronic device according to claim 14, wherein the interposer substrate includes an insulating base material layer that has a smaller effective elastic modulus than the first circuit board and the second circuit board.

17. The electronic device according to claim 14, wherein the interposer substrate includes a bent portion that bends so as to avoid a component that is mounted on at least one of the first circuit board and the second circuit board.

18. The electronic device according to claim 14, wherein the interposer substrate surrounds a component that is mounted on at least one of the first circuit board and the second circuit board.

19. An electronic device comprising:
a first circuit board;
a second circuit board; and
an interposer substrate including a first principal surface and a second principal surface and being entirely or substantially entirely interposed between the first circuit board and the second circuit board, wherein
the first principal surface of the interposer substrate faces the first circuit board;
the second principal surface of the interposer substrate faces the second circuit board;
the interposer substrate includes:
a signal line including a first end and a second end;
a first input/output pad provided on the first principal surface and including:
a first electrode electrically connected to the first end of the signal line; and
a second electrode electrically connected to a ground conductor;
a second input/output pad provided on the second principal surface and including:
a third electrode electrically connected to the second end of the signal line; and
a fourth electrode electrically connected to a ground conductor; and
a first auxiliary pad provided on the first principal surface and between the first input/output pad and the second input/output pad in an extending direction of the signal line;
the first circuit board, on a surface thereof that faces the interposer substrate, includes:
a first input/output land connected to the first input/output pad; and
a first auxiliary land connected to the first auxiliary pad;
the first input/output pad and the first auxiliary pad are respectively directly soldered to the first input/output land and the first auxiliary land of the first circuit board, and the interposer substrate and the first circuit board are electrically connected to each other;
the second circuit board is electrically connected to the interposer substrate through the second input/output pad; and the interposer substrate includes a multilayer body including a plurality of insulating base material layers that include an insulating base material layer on which a conductor pattern is provided.

20. The electronic device according to claim 19, wherein the interposer substrate includes ground conductors provided on a plurality of insulating base material layers; and
the ground conductors, the signal line, an insulating base material layer between the ground conductors and the signal line define a stripline.

21. The electronic device according to claim 20, wherein the interposer substrate includes a plurality of interlayer connection conductors that connect ground conductors provided on different insulating base material layers at a plurality of portions.

22. The electronic device according to claim 19, wherein the interposer substrate includes a bent portion that bends so as to avoid a component that is mounted on at least one of the first circuit board and the second circuit board.

23. The electronic device according to claim 19, wherein the interposer substrate surrounds a component that is mounted on at least one of the first circuit board and the second circuit board.

24. The electronic device according to claim 3, wherein the interposer substrate includes:
   a first connection portion that includes the first input/output pad;
   a second connection portion that includes the second input/output pad;
   a line portion that is provided between the first connection portion and the second connection portion; and
   an auxiliary connection portion provided in a middle region of the line portion and including no input/output pad;
the first auxiliary pad is provided on the first principal surface in the auxiliary connection portion;
the second auxiliary pad is provided on the second principal surface in the auxiliary connection portion; and
the line portion has a smaller width than the first connection portion, the second connection portion, and the auxiliary connection portion.

25. The electronic device according to claim 8, wherein the interposer substrate includes:
   a first connection portion that includes the first input/output pad;
   a second connection portion that includes the second input/output pad;
   a line portion that is provided between the first connection portion and the second connection portion; and
   an auxiliary connection portion provided in a middle region of the line portion and including no input/output pad;
the first auxiliary pad is provided on the first principal surface in the auxiliary connection portion;
the second auxiliary pad is provided on the second principal surface in the auxiliary connection portion; and
the line portion has a smaller width than the first connection portion, the second connection portion, and the auxiliary connection portion.

26. The electronic device according to claim 19, wherein
the interposer substrate includes a second auxiliary pad provided on the second principal surface and between the first input/output pad and the second input/output pad in the extending direction of the signal line;
the second circuit board, on a surface thereof that faces the interposer substrate, includes:
   a second input/output land that is connected to the second input/output pad; and
   a second auxiliary land that is connected to the second auxiliary pad;
the second input/output pad and the second auxiliary pad are respectively directly soldered to the second input/output land and the second auxiliary land of the second circuit board, and the interposer substrate and the second circuit board are electrically connected to each other;
the interposer substrate includes:
   a first connection portion that includes the first input/output pad;
   a second connection portion that includes the second input/output pad;
   a line portion that is provided between the first connection portion and the second connection portion; and
   an auxiliary connection portion provided in a middle region of the line portion and including no input/output pad;
the first auxiliary pad is provided on the first principal surface in the auxiliary connection portion;
the second auxiliary pad is provided on the second principal surface in the auxiliary connection portion; and
the line portion has a smaller width than the first connection portion, the second connection portion, and the auxiliary connection portion.

* * * * *